(12) United States Patent
Matsubara

(10) Patent No.: US 10,899,670 B2
(45) Date of Patent: Jan. 26, 2021

(54) MANUFACTURING METHOD OF CERAMIC ELECTROSTATIC CHUCK

(71) Applicant: Blue Ocean Research & Network Limited, Zhubei (TW)

(72) Inventor: Manabu Matsubara, Zhubei (TW)

(73) Assignee: Blue Ocean Research & Network Limited, Zhubei (TW)

( * ) Notice: Subject to any disclaimer, the term of this patent is extended or adjusted under 35 U.S.C. 154(b) by 70 days.

(21) Appl. No.: 16/130,338

(22) Filed: Sep. 13, 2018

(65) Prior Publication Data

US 2019/0359530 A1     Nov. 28, 2019

(30) Foreign Application Priority Data

May 25, 2018   (JP) .................................. 2018-100819

(51) Int. Cl.
| | | |
|---|---|---|
| *C04B 35/622* | (2006.01) | |
| *B32B 18/00* | (2006.01) | |
| *H01L 21/687* | (2006.01) | |
| *H01L 21/683* | (2006.01) | |

(52) U.S. Cl.
CPC ............ *C04B 35/622* (2013.01); *B32B 18/00* (2013.01); *C04B 2235/608* (2013.01); *C04B 2235/77* (2013.01); *H01L 21/6833* (2013.01)

(58) Field of Classification Search
CPC .............. C04B 35/622; C04B 2235/77; C04B 2235/608; B32B 18/00; H01L 21/6833; H01L 21/6831; H01L 21/68785
See application file for complete search history.

(56) References Cited

U.S. PATENT DOCUMENTS

| 5,745,331 A * | 4/1998 | Shamouilian ....... H01L 21/6831 361/234 |
| 5,883,778 A * | 3/1999 | Sherstinsky ........ C23C 16/4586 361/234 |
| 5,946,183 A * | 8/1999 | Yamada ................... G03F 7/707 279/128 |

(Continued)

FOREIGN PATENT DOCUMENTS

| JP | H07273164 A | 10/1995 |
| JP | 2000143361 A | 5/2000 |

(Continued)

OTHER PUBLICATIONS

Office Action dated Jul. 9, 2019 in corresponding Japanese Patent Application No. 2018-100819, 3 pages.

*Primary Examiner* — Peter Dungba Vo
*Assistant Examiner* — Kaying Kue
(74) *Attorney, Agent, or Firm* — Buchanan Ingersoll & Rooney PC

(57) ABSTRACT

The present invention provides a method for manufacturing a ceramic electrostatic chuck which enables high purity and minimum thickness variation of a dielectric layer formed of ceramics or composite ceramics. The method includes: forming grooves for electrode pattern formation in a dielectric layer formed of ceramics or composite ceramics and having a density of 95% or greater; forming an electrode pattern by filling the grooves with a metal; forming an activated bonding layer configured for joining on the dielectric layer; and joining an insulator layer, which is formed of ceramics or composite ceramics and has a density of 95% or greater, with the dielectric layer.

16 Claims, 3 Drawing Sheets

(56) References Cited

U.S. PATENT DOCUMENTS

| | | | | |
|---|---|---|---|---|
| 6,365,879 B1* | 4/2002 | Kuibira | ............ | H01L 21/67103 |
| | | | | 219/444.1 |
| 2003/0141345 A1* | 7/2003 | Shinkai | .................. | B32B 18/00 |
| | | | | 228/122.1 |
| 2006/0120010 A1* | 6/2006 | Kameyama | ......... | H01L 21/6831 |
| | | | | 361/234 |
| 2008/0062611 A1* | 3/2008 | Himori | ............... | H01L 21/6833 |
| | | | | 361/234 |
| 2008/0212255 A1* | 9/2008 | Miyaji | .............. | H01L 21/68757 |
| | | | | 361/234 |
| 2008/0268583 A1* | 10/2008 | Yamazaki | ........... | H01L 21/2007 |
| | | | | 438/151 |
| 2008/0303118 A1* | 12/2008 | Arena | ............... | H01L 21/76254 |
| | | | | 257/615 |
| 2010/0109137 A1* | 5/2010 | Sasaki | .................. | H01L 23/367 |
| | | | | 257/684 |
| 2011/0062600 A1* | 3/2011 | Ueno | .................. | H01L 23/5385 |
| | | | | 257/784 |
| 2013/0168369 A1* | 7/2013 | Ishida | ............ | H01J 37/32009 |
| | | | | 219/121.36 |
| 2013/0207214 A1* | 8/2013 | Haddad | ............... | H01L 31/0236 |
| | | | | 257/432 |
| 2013/0330509 A1* | 12/2013 | Otsubo | .................. | B32B 18/00 |
| | | | | 428/137 |

FOREIGN PATENT DOCUMENTS

| | | | |
|---|---|---|---|
| JP | 2002176096 A | | 6/2002 |
| JP | 2006073780 A | | 3/2006 |
| JP | 2009004649 A | | 1/2009 |
| JP | 2011148688 A | | 8/2011 |

* cited by examiner

MANUFACTURING METHOD OF CERAMIC ELECTROSTATIC CHUCK

CROSS REFERENCE TO RELATED APPLICATIONS

The present application claims priority from Japanese Patent application JP 2018-100819 filed on May 25, 2018, entitled "MANUFACTURING METHOD OF CERAMIC ELECTROSTATIC CHUCK", the contents of which is hereby incorporated by reference in its entirety for all purposes.

BACKGROUND OF THE INVENTION

Technical Field

The present invention involves a manufacturing method of a ceramic electrostatic chuck, and particularly involves a manufacturing method of a ceramic electrostatic chucks used in fabrication of semiconductor or liquid crystal display (LCD) panels.

Description of the Prior Art

Conventional methods for manufacturing ceramic electrostatic chucks generally includes: laminating and sintering green sheets as well as green sheets printed with high-melting metal (e.g., tungsten or molybdenum) paste for electrode formation; and sintering (such as hot-pressing) high-melting metal (e.g., tungsten or molybdenum) plates for electrode formation as well as ceramic powder surrounding the plates.

Prior Art Documents

Patent Document 1: JP 2009-004649A
Patent Document 2: JP H07-273164A

However, in the abovementioned methods employing high temperature sintering, there may be variations in the thickness of the formed dielectric layer due to the shrinkage of ceramics. Furthermore, in the methods employing laminated green sheets, it is necessary to add auxiliary agents for body forming and diffusion components for obtaining adhesion with high-melting metals. Accordingly, it is difficult to obtain ceramics having a high purity. Moreover, in the methods employing hot-pressing, one restriction is that the electrode needs to be mesh-shaped, since voids easily occur at the interface between the ceramics and the high-melting metal plates used as electrodes.

SUMMARY OF THE INVENTION

In view of the problems set forth above, the present invention provides a method for manufacturing a ceramic electrostatic chuck which enables high purity and minimum thickness variation of a dielectric layer. The method comprises: forming grooves for electrode pattern formation in a dielectric layer formed of ceramics or composite ceramics and having a density of 95% or greater; forming an electrode pattern by filling the grooves with a metal; forming an activated bonding layer configured for joining on the dielectric layer; and joining an insulator layer, which is formed of ceramics or composite ceramics and has a density of 95% or greater, with the dielectric layer.

In the present invention, additives used in conventional methods for promoting sinterability are not required. Further, even if additives for adjustment of resistance values are added to composite ceramics used in the present invention, no other additives are contained in such composite ceramics.

DETAILED DESCRIPTION OF THE PREFERRED EMBODIMENTS

Figure 1:
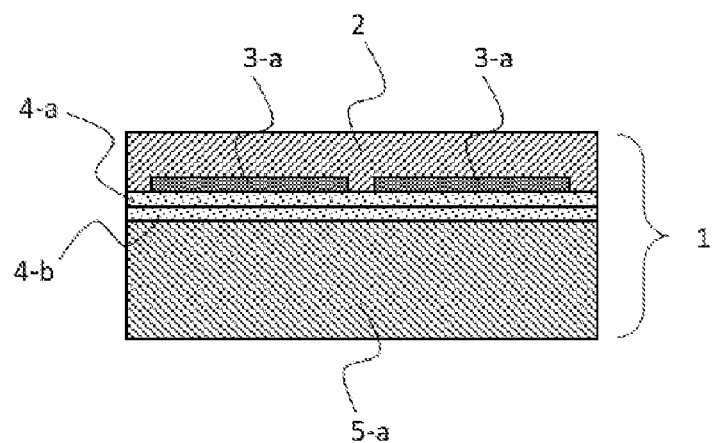
FIG. 1 is a cross-sectional view of an electrostatic chuck manufactured according to an embodiment of the present invention.

FIG. 1 is a cross-sectional view of an electrostatic chuck manufactured according to an embodiment of the present invention.

As shown in FIG. 1, an electrostatic chuck 1 includes: a dielectric layer 2, an electrode pattern 3-$a$, a bonding layer 4-$a$ on dielectric layer side, a bonding layer 4-$b$ on first insulator layer side, and a first insulator layer 5-$a$.

The dielectric layer 2 is a dielectric formed of a sintered body of a ceramic material or a composite ceramic material, which has a density of 95% and more. The ceramic material may be, for example, $Al_2O_3$, sapphire, $Y_2O_3$, AlN, $Si_3N_4$, etc. With regard to volume resistivity for the ceramic material or composite ceramic material of the sintered body, the dielectric layer and the insulator layers may have a volume resistivity of $1.0E+8(\Omega cm)$ or greater. Further, composite materials, into which SiC, $TiO_2$, TiN, etc. are added for adjustment of resistance values, may be used for the dielectric layer and the insulator layers.

The electrode pattern 3-$a$ is an electrode formed of a material, such as metals, embedded in grooves formed into a pattern in the dielectric layer 2. In the case that metals or their alloys are employed, for example, metals within the range from group IVB to group IB of the periodic table are used.

The bonding layer 4-$a$ on dielectric layer side and the bonding layer 4-$b$ on first insulator layer side are configured to join the dielectric layer 2 and the first insulator layer 5-$a$ together. The bonding layer 4-$a$ on dielectric layer side and the bonding layer 4-$b$ on first insulator layer side are respectively formed of surface-activated ceramics. The thicknesses of the bonding layers are not specifically limited, but the total thickness of the bonding layers after being joined are preferably 50 μm or less.

The insulator layer 5-$a$ is an insulator formed of a sintered body of a ceramic material or a composite ceramic material, which has a density of 95% and more.

Figure 2:
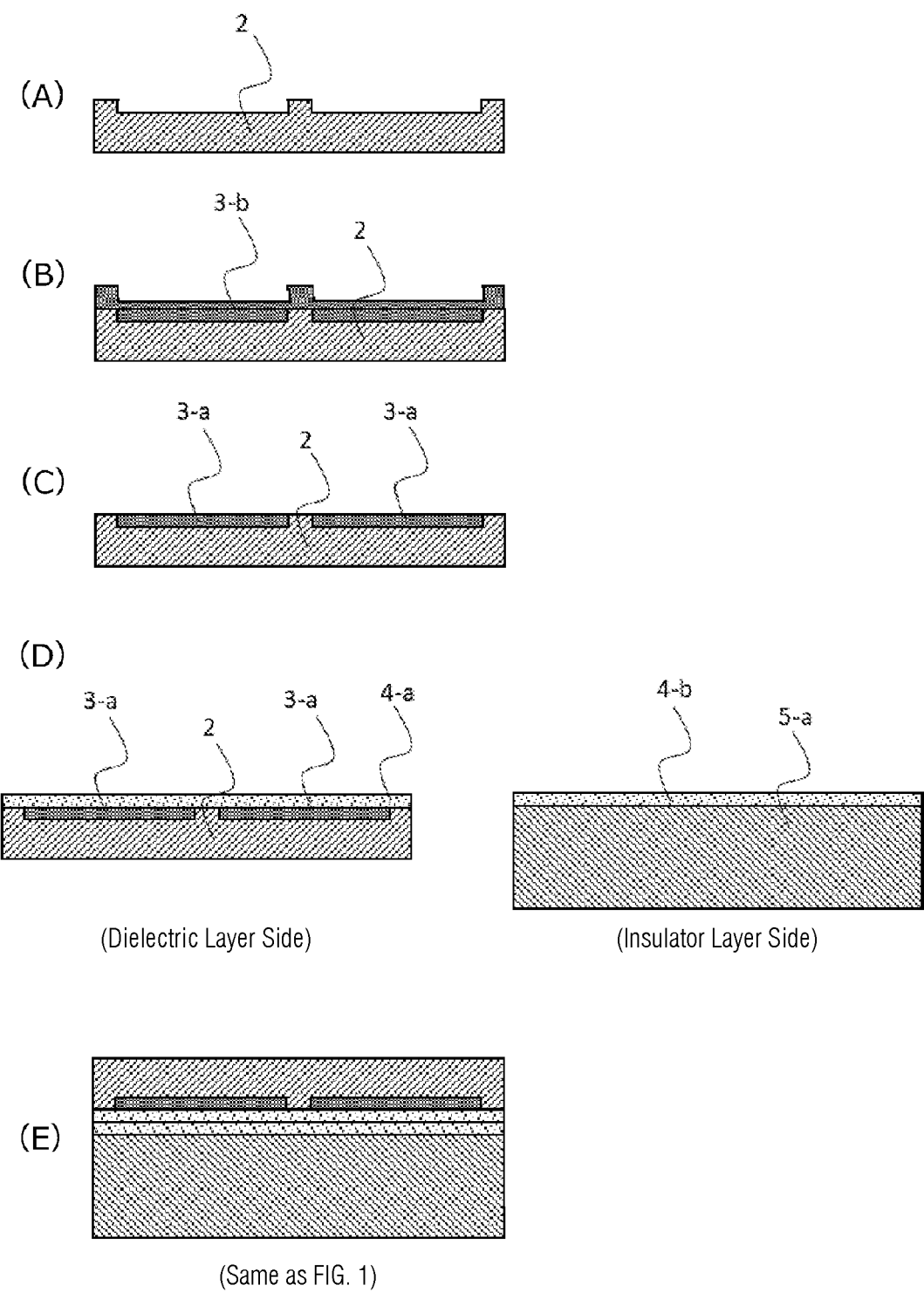
FIG. 2 illustrates cross-sectional views of respective steps of the present invention.

Next, referring to FIG. 2, a method of manufacturing a ceramic electrostatic chuck is described.

A ceramic material or composite ceramic material with a high purity is sintered for preparing a dielectric having a density of 95% or greater in advance.

As shown in (A) of FIG. 2, the sintered ceramic or composite ceramic dielectric having a density of 95% or greater is processed to have a flatness of 0.05 mm or less, and then processed to form a desired electrode pattern thereon, thereby forming the dielectric layer 2.

Further, as shown in (B) of FIG. 2, a metal layer 3-*b* functioned as an electrode is formed on a surface of the dielectric layer 2 on which the abovementioned grooves are formed. The metal layer 3-*b* may be formed using metallization methods such as plating, thermal spraying, chemical vapor deposition (CVD), or physical vapor deposition (PVD). The metal layer 3-*b* is preferably formed to have a thickness greater than the depth of the grooves. Next, as shown in (C) of FIG. 2, by grinding and polishing the surface on which the metal layer 3-*b* is formed, the remaining metal in the grooves is exposed to be the electrode pattern 3-*a*.

As shown in (D) of FIG. 2, the bonding layer 4-*a* on dielectric layer side, which is configured for attachment to the first insulator layer 5-*a*, is formed on a surface of the dielectric layer 2 on which the electrode pattern 3-*a* is formed. The bonding layer 4-*a* on dielectric layer side may be formed using film forming approaches such as CVD or PVD. The bonding layer 4-*a* on dielectric layer side is formed to have a film thickness greater than the surface roughness Rz of the surface on which the electrode pattern is formed.

Further, the first insulator layer 5-*a* to be bonded to the dielectric layer 2 is prepared in advance. Similar to the dielectric layer 2, the first insulator 5-*a* has the bonding layer 4-*b* on first insulator layer side formed thereon.

The bonding layer 4-*a* on dielectric layer side and the bonding layer 4-*b* on first insulator layer side are polished for adjusting the surface roughness thereof, such that there is no gap between the joined bonding layers 4-*a* and 4-*b*. The surface roughness is preferably 0.1 µm or less.

After the adjustment of surface roughness has been performed, the bonding layer 4-*a* on dielectric layer side and the bonding layer 4-*b* on first insulator layer side are activated via plasma, etc. Such activating technique can be found in, for example, JP 2006-073780, the content of which is hereby incorporated by reference in its entirety for all purposes.

As a final stage, the surface-activated bonding layers are stacked and joined together at a low temperature and under a low load, thereby obtaining the electrostatic chuck 1 provided with the electrode pattern 3 therein, as shown in (E) of FIG. 2. Since sintered ceramics or composite ceramics can be joined at a low temperature and under a low load, and electrostatic chuck having a high purity and suppressed variation in thickness of the dielectric layer can be manufactured.

Figure 3:
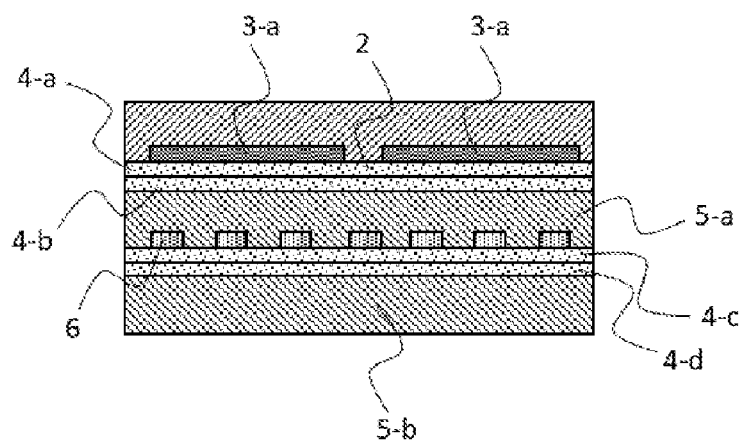
FIG. 3 is a cross-sectional view of an electrostatic chuck manufactured according to another embodiment of the present invention.

As further shown in FIG. 3, in the method of the present invention, in addition to the electrode disposed in the electrostatic chuck, a metallic component functioned as a heater may also be disposed in the electrostatic chuck. In the example shown in FIG. 3, a heater pattern 6 is first formed in the first insulator layer 5-*a*, followed by joining the first insulator layer 5-*a* with a second insulator layer 5-*b*. In such case, 4-*c* denotes a bonding layer on heater side, and 4-*d* denotes a bonding layer on second insulator layer side.

Figure 4:
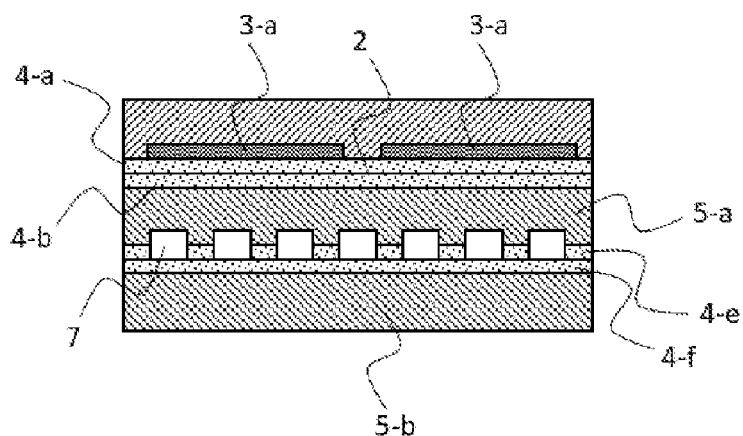
FIG. 4 is a cross-sectional view of an electrostatic chuck manufactured according to yet another embodiment of the present invention.

Further, as can be seen in FIG. 4, grooves are provided in the electrostatic chuck for introducing cooling gases, for example, to an absorbed surface of an absorbed object to be cooled. In the example shown in FIG. 4, introduction grooves 7 are formed in the first insulator layer 5-*a*, followed by joining the first insulator 5-*a* with the second insulator layer 5-*b*. In such case, 4-*e* denotes a bonding layer on introduction groove side, and 4-*f* denotes a bonding layer on second insulator layer side.

Although the present invention has been described in detail with reference to the preferred embodiments and drawings, those with ordinary skill in the art would understand that various modifications, changes, and equivalents can be made without departing from the spirit and scope of the present invention. However, these modifications, changes, and equivalents should also be included in the scope of the present invention.

The invention claimed is:

1. A method for manufacturing a ceramic electrostatic chuck, comprising:
    forming grooves for electrode pattern formation in a dielectric layer which consists of ceramics or composite ceramics and has a density of 95% or greater;
    forming an electrode pattern by filling the grooves with a metal, wherein the electrode pattern is formed by depositing a metal layer in the grooves until metal filled grooves are formed, and the metal layer is deposited until the metal layer has a thickness greater than a depth of the grooves;
    grinding and polishing the metal layer until the metal filled grooves are exposed;
    forming a first bonding layer configured for joining on the dielectric layer, wherein the first bonding layer is deposited over an exposed surface of the dielectric layer such that the metal filled grooves are covered by the first bonding layer;
    polishing and activating the first bonding layer; and
    joining an insulator layer with the dielectric layer, wherein the insulator layer consists of ceramics or composite ceramics and has a density of 95% or greater, and wherein the insulator layer is provided with a second bonding layer thereon, the second bonding layer being polished and activated.

2. The method of claim 1, wherein a volume resistivity of each of the dielectric layer and the insulator layer consisting of ceramics or composite ceramics is 1.0E+8(Ωcm) or greater.

3. The method of claim 2, wherein a total thickness of the first bonding layer and the second bonding layer is 50 µm or less.

4. The method of claim 1, wherein a total thickness of the first bonding layer and the second bonding layer is 50 µm or less.

5. The method of claim 1, wherein the metal is deposited by plating, thermal spraying, chemical vapor deposition or physical vapor deposition.

6. The method of claim 1, wherein the second bonding layer is deposited over an exposed surface of the insulator layer.

7. The method of claim 6, wherein an exposed surface of the second bonding layer is joined to an exposed surface of the first bonding layer.

8. The method of claim 7, wherein the first bonding layer and the second bonding layer are surface-activated ceramics and the exposed surface of the first bonding layer and the exposed layer of the second bonding layer are polished to a surface roughness of 0.1 µm or less.

9. The method of claim 6, wherein the second bonding layer is deposited by chemical vapor deposition or physical vapor deposition.

10. The method of claim 1, wherein the first bonding layer is deposited by chemical vapor deposition or physical vapor deposition.

11. The method of claim 1, wherein the dielectric layer comprises a sintered body of ceramic material.

12. The method of claim 11, wherein the ceramic material comprises $Al_2O_3$ or AlN.

13. The method of claim 11, wherein the ceramic material comprises sapphire, $Y_2O_3$ or $Si_3N_4$.

14. The method of claim 1, wherein the dielectric layer is processed to have a surface flatness of 0.05 mm or less prior to forming the grooves for the electrode pattern.

15. A method for manufacturing a ceramic electrostatic chuck, comprising:
    forming grooves for electrode pattern formation in a dielectric layer which consists of ceramics or composite ceramics and has a density of 95% or greater;
    forming an electrode pattern by filling the grooves with a metal;
    forming a first bonding layer configured for joining on the dielectric layer;
    polishing and activating the first bonding layer; and
    joining an insulator layer with the dielectric layer, wherein the insulator layer consists of ceramics or composite ceramics and has a density of 95% or greater, and wherein the insulator layer is provided with a second bonding layer thereon, the second bonding layer being polished and activated,
    wherein the insulator layer comprises a first insulator layer, a heater layer, a third bonding layer, a fourth bonding layer and a second insulator layer, the method further comprising forming a heater pattern on an exposed surface of the first insulator layer, forming the third bonding layer over the heater pattern, forming the fourth bonding layer on an exposed surface of the second insulator layer, and joining the third bonding layer to the fourth bonding layer.

16. A method for manufacturing a ceramic electrostatic chuck, comprising:
    forming grooves for electrode pattern formation in a dielectric layer which consists of ceramics or composite ceramics and has a density of 95% or greater;
    forming an electrode pattern by filling the grooves with a metal;
    forming a first bonding layer configured for joining on the dielectric layer;
    polishing and activating the first bonding layer; and
    joining an insulator layer with the dielectric layer, wherein the insulator layer consists of ceramics or composite ceramics and has a density of 95% or greater, and wherein the insulator layer is provided with a second bonding layer thereon, the second bonding layer being polished and activated,
    wherein the insulator layer comprises a first insulator layer, coolant grooves for circulating cooling gases in the insulator layer, a third bonding layer, a fourth bonding layer and a second insulator layer, the method further comprising forming the coolant grooves in an exposed surface of the first insulator layer, forming the third bonding layer over the coolant grooves, forming the fourth bonding layer on an exposed surface of the second insulator layer, and joining the third bonding layer to the fourth bonding layer.

\* \* \* \* \*